United States Patent
Wu et al.

(10) Patent No.: US 10,534,400 B2
(45) Date of Patent: Jan. 14, 2020

(54) FOLDABLE ELECTRONIC DEVICE

(71) Applicant: InnoLux Corporation, Miao-Li County (TW)

(72) Inventors: Yuan-Lin Wu, Miao-Li County (TW); Kuan-Feng Lee, Miao-Li County (TW); Chin-Lung Ting, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 0 days.

(21) Appl. No.: 15/987,917

(22) Filed: May 24, 2018

(65) Prior Publication Data

US 2019/0361494 A1  Nov. 28, 2019

(51) Int. Cl.
*G06F 1/16* (2006.01)
*H04M 1/02* (2006.01)

(52) U.S. Cl.
CPC .......... *G06F 1/1652* (2013.01); *G06F 1/1618* (2013.01); *G06F 1/1641* (2013.01); *H04M 1/0268* (2013.01)

(58) Field of Classification Search
CPC .............................. G06F 1/1652; G06F 1/1641
See application file for complete search history.

(56) References Cited

U.S. PATENT DOCUMENTS

| | | | | |
|---|---|---|---|---|
| 2014/0042406 A1* | 2/2014 | Degner | ................. | H01L 27/326 257/40 |
| 2014/0240985 A1* | 8/2014 | Kim | ....................... | H05K 1/028 362/249.04 |
| 2016/0165697 A1* | 6/2016 | Jang | ....................... | H05B 33/22 313/511 |
| 2018/0004254 A1* | 1/2018 | Park | ...................... | G06F 1/1626 |
| 2018/0166652 A1* | 6/2018 | Kim | ........................... | B32B 7/12 |
| 2018/0364764 A1* | 12/2018 | Lin | ....................... | G06F 1/1616 |

* cited by examiner

*Primary Examiner* — Nidhi Thaker
(74) *Attorney, Agent, or Firm* — Winston Hsu

(57) ABSTRACT

A foldable electronic device includes an electronic element including a folding line and a cover layer connected to the electronic element through an intermediate layer. The electronic element, the cover layer and the intermediate layer form at least one air gap across the folding line.

12 Claims, 12 Drawing Sheets

FOLDABLE ELECTRONIC DEVICE

BACKGROUND OF THE DISCLOSURE

1. Field of the Disclosure

The present disclosure is related to a foldable electronic device, and more particularly, to a foldable display device.

2. Description of the Prior Art

In recent years, foldable electronic devices have become one of the focuses of the new generation electronic technology. The demand of the foldable display device that can be integrated in the foldable electronic device is therefore increased. A foldable display device means the device can be curved, folded, stretched, flexed, or the like. However, some elements or films in the folding part of the conventional display device, such as the electrodes, the active layer of thin film transistors (TFTs), the capacitors, and the signal lines, may be damaged due to the stress induced by folding or flexing mode of the display device, which influences the light emitting quality and the properties of the TFT will be affected. Thus, the stability and the reliability of the foldable display device are seriously affected.

SUMMARY OF THE DISCLOSURE

In some embodiments, the present disclosure provides a display device that includes a display panel and a cover layer. The display panel includes a folding line. The cover layer is connected to the display panel through an intermediate layer. The display panel, the cover layer and the intermediate layer format least one air gap across the folding line.

In some embodiments, the present disclosure provides a foldable electronic device that includes an electronic element and a cover layer. The electronic element includes a folding line. The cover layer is connected to the electronic element through an intermediate layer. The electronic element, the cover layer and the intermediate layer format least one air gap across the folding line. The electronic element can be a display panel.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the display device, and certain elements in various drawings may not be drawn to scale. In addition, the number and dimension of each device shown in drawings are only illustrative and are not intended to limit the scope of the present disclosure.

Certain terms are used throughout the description and following claims to refer to particular components. As one skilled in the art will understand, electronic equipment manufacturers may refer to a component by different names. This document does not intend to distinguish between components that differ in name but not function. In the following description and in the claims, the terms "include", "comprise" and "have" are used in an open-ended fashion, and thus should be interpreted to mean "include, but not limited to . . . ".

It will be understood that when an element or layer is referred to as being "on" or "connected to" another element or layer, it can be directly on or directly connected to the other element or layer, or intervening elements or layers may be presented. In contrast, when an element is referred to as being "directly on" or "directly connected to" another element or layer, there are no intervening elements or layers presented.

It should be noted that the technical features in different embodiments described in the following can be replaced, recombined, or mixed with one another to constitute another embodiment without departing from the spirit of the present disclosure.

Figure 1:
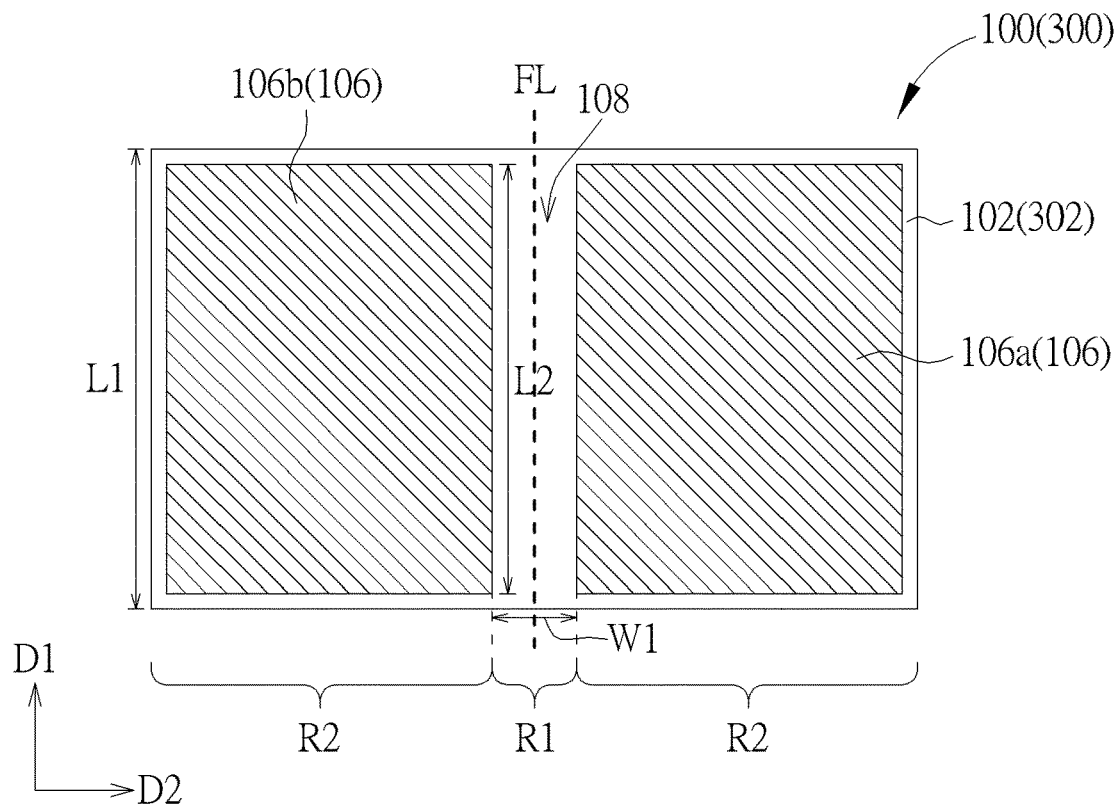
FIG. 1 is a schematic diagram of a top view of a foldable electronic device according to a first embodiment of the present disclosure.
Figure 2:
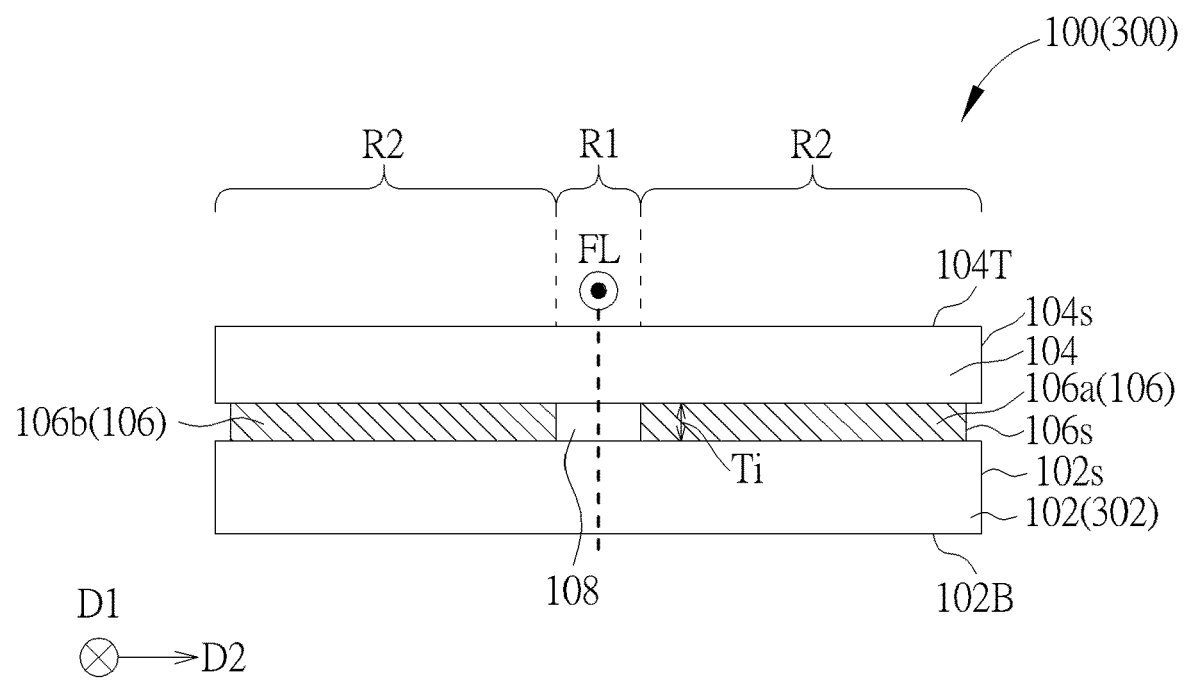
FIG. 2 is a schematic diagram of a cross-sectional view of the foldable electronic device shown in FIG. 1.

Referring to FIG. 1 to FIG. 2, FIG. 1 is a schematic diagram of a top view of a foldable electronic device according to a first embodiment of the present disclosure, and FIG. 2 is a schematic diagram of a cross-sectional view of the foldable electronic device shown in FIG. 1. The terms "foldable" and "folded" in the present disclosure means curved, bended, folded, rolled, stretched, flexed, or the like (generally referred to as "folded" or "foldable" hereinafter) along at least one folding axis, which is in parallel with a specific direction, for example, a first direction D1. The foldable electronic device 300 of this embodiment includes an electronic element 302 and a cover layer 104 connected to the electronic element 302 through an intermediate layer 106. As mentioned above, the electronic element 302 of the foldable electronic device 300 includes a folding line FL that extends along the first direction D1. The folding line FL represents the folding axis of the electronic element 302 when it is in a folding state or a folding mode.

According to some embodiments, the electronic element 302 can be a display panel. Alternatively, according to some embodiments, the electronic element 302 can be an electronic element that has no display function, for example, an antenna, such as a liquid crystal antenna.

Figure 5:
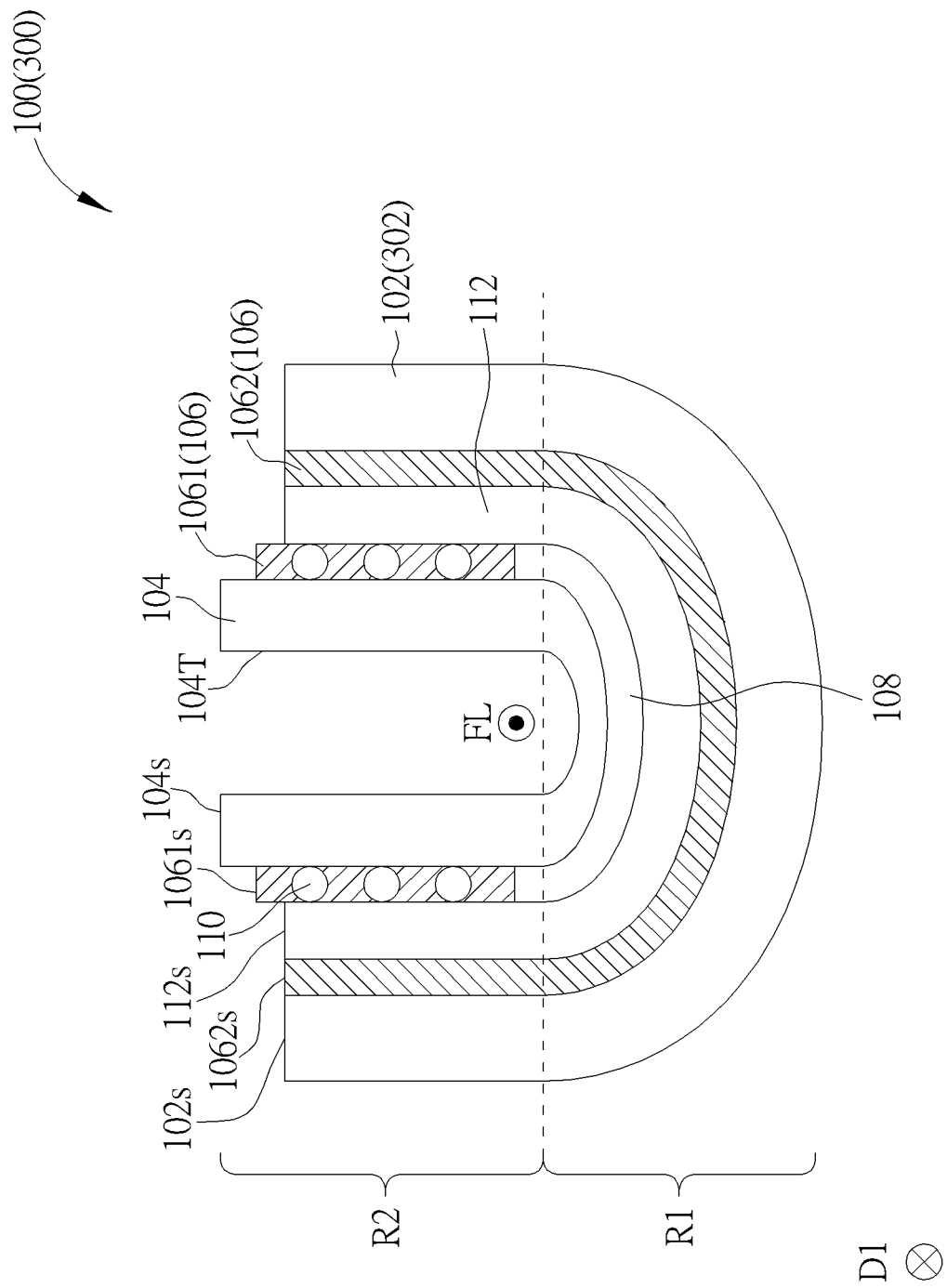
FIG. 5 is a schematic diagram illustrating the display device shown in FIG. 3 being folded inwardly.

For easy explanation, regarding the electronic element 302, a display panel 102 will be taken as an example in the following descriptions. Thus, when the electronic element 302 is the display panel 102, the foldable electronic device 300 is a foldable display device 100. The display device 100 includes a foldable portion R1 and two main portions R2. The foldable portion R1 is positioned between and connects the two main portions R2 along a second direction D2. The second direction D2 can be perpendicular to the first direction D1 in this embodiment for example. Accordingly, the foldable portion R1 overlaps the folding line FL, and the folding line FL pass through the foldable portion R1 in a top view of the display device 100, as shown in FIG. 1. In this embodiment, the display device 100 may be folded outwardly or inwardly. The outward-folding mode may indicate that the display device 100 is folded with the state of two sides (corresponding to the main portions R2) of the bottom surface 102B of the display panel 102 face each other. In contrast, the inward-folding mode may indicate that the display device 100 is folded with the state of two sides (corresponding to the main portions R2) of the top surface 104T of the cover layer 104 face each other, for example, as shown in FIG. 5. The display panel 102 may be any type of known display panel, such as liquid crystal display (LCD) panel, organic light emitting display (OLED) panel, light emitting display (mini LED or micro LED) panel, and quantum dot LED display panel, but not limited thereto. In some embodiments, the display panel 102 can be a touch display panel. The cover layer 104 provides a protection function to the display panel 102. The cover layer 104 may be made of organic material (such as a polymer film) or inorganic material (such as glass). In this embodiment, the area of the cover layer 104 is substantially the same as the display panel 102, but not limited thereto. Invariant embodiments, the cover layer 104 may have a larger area than the display panel 102 for example.

The intermediate layer 106 can be used for attaching the cover layer 104 onto the display panel 102. For example, the intermediate layer 106 may include an adhesive material, such as glue or optical clear adhesive (OCA) material, but not limited thereto. In some embodiments, the intermediate layer 106 may include the material with mechanical strength lower than 100 gf/in$^2$. For instance, the intermediate layer 106 may include one or more materials of polyacrylate, polymer including polyacrylate and silicon, and rubber-like natural or synthetic carbon compound, but not limited thereto. In some embodiments, the young's modulus of the intermediate layer 106 may range from 0.01 Gpa to 1 Gpa. The intermediate layer 106 can have a thickness Ti in a range from 0.01 mm to 1 mm, but not limited thereto.

According to the present disclosure, as mentioned above, although the intermediate layer 106 can be used for attaching the cover layer 104 onto the display panel 102, there is a region between the cover layer 104 and the display panel 102, which has no intermediate layer 106. Specifically, the cover layer 104, the intermediate layer 106, and the display panel 102 form at least one air gap 108 across the folding line FL. The air gap 108 is disposed in the intermediate layer 106, and between the cover layer 104 and the display panel 102. In this embodiment, there is one air gap 108 existing in the intermediate layer 106, and the air gap 108 overlaps the folding line FL and extends along the folding line FL, as well as the first direction D1. The air gap 108 may be filled with air or any gas in the formation process. In the embodiments of the present disclosure, the position of the air gap across the folding line does not necessarily means that the air gap has a width greater than the width of the foldable portion. In other words, the width of the air gap along the second direction D2 may be adjusted according to different embodiments. For example, the width of the air gap can be larger than, equal to, or smaller than the width of the foldable portion R1 in the second direction D2.

Figure 3:
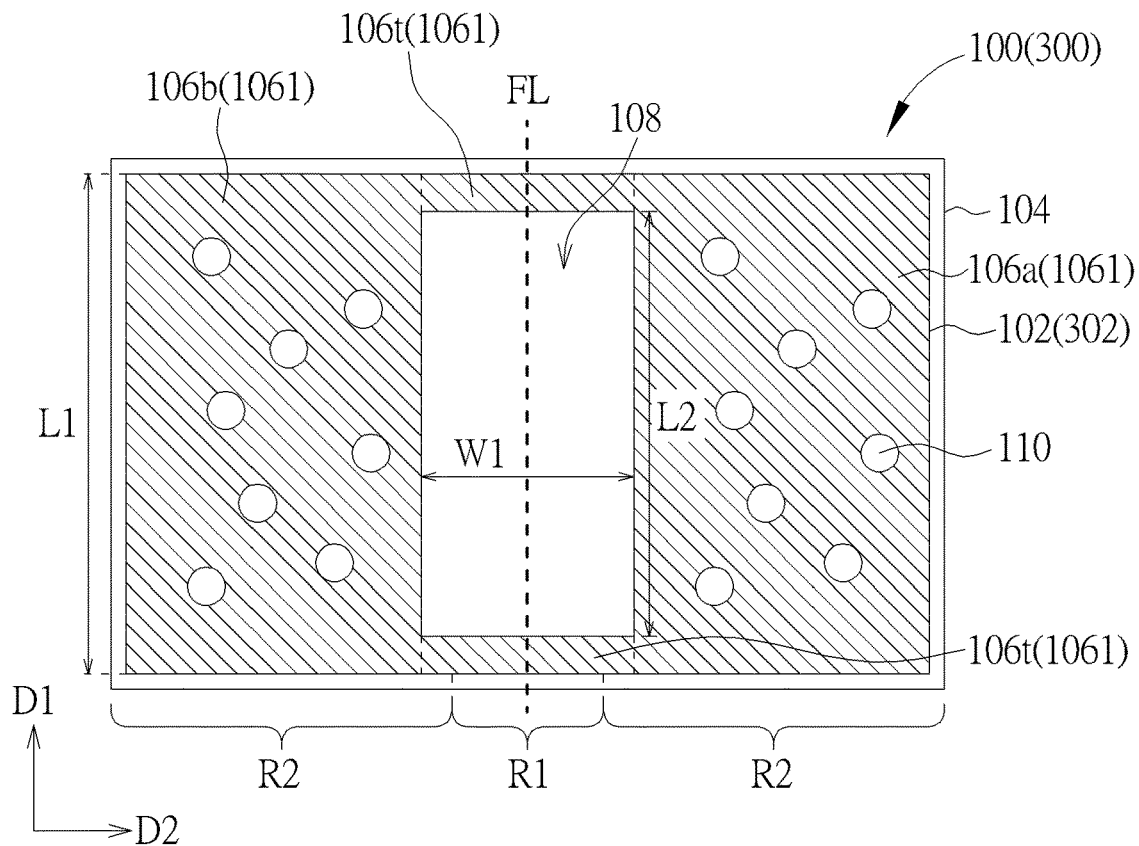
FIG. 3 is a schematic diagram of a top view of a display device according to a second embodiment of the present disclosure.
Figure 9:
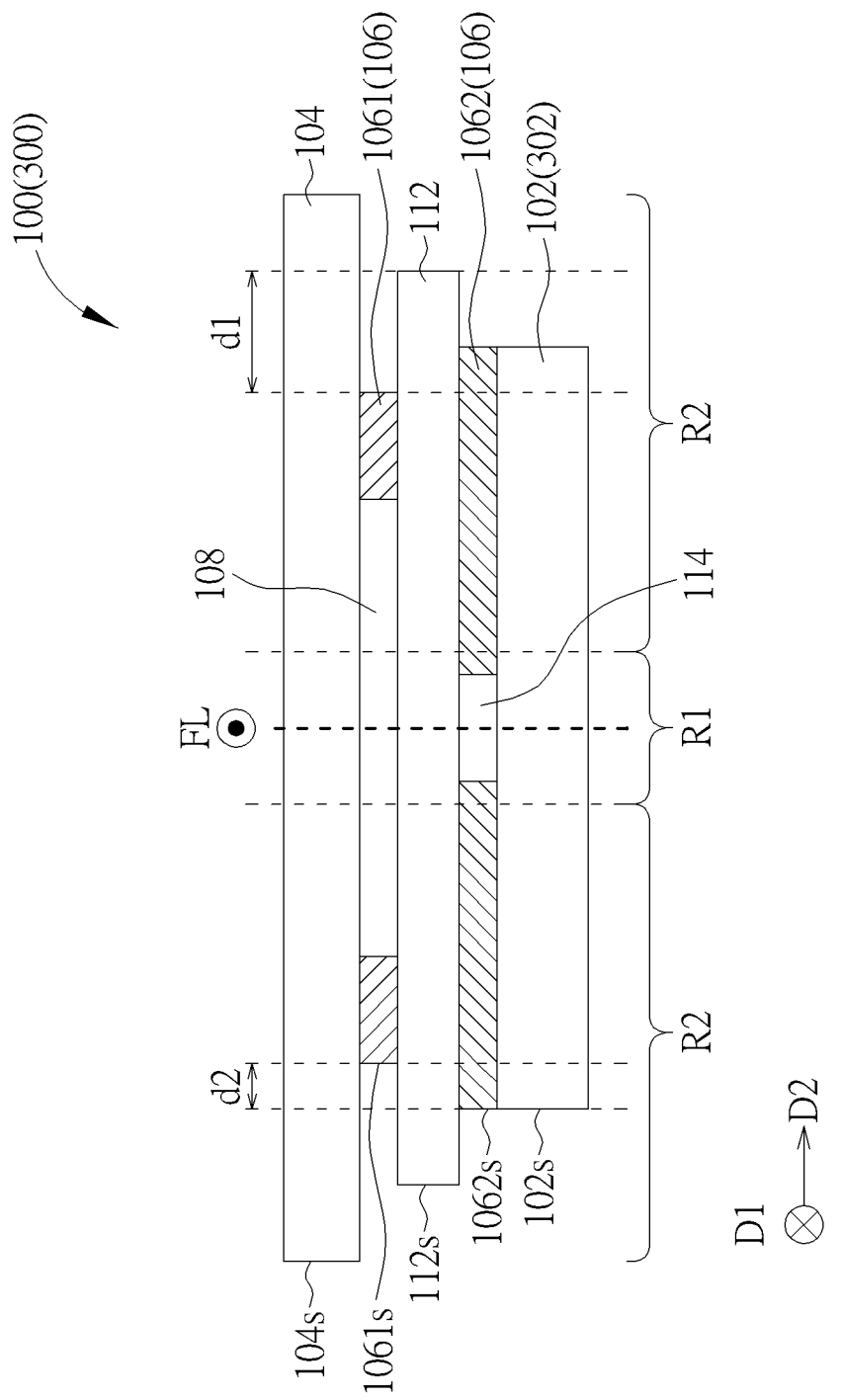
FIG. 9 is a schematic diagram of a sectional view of a display device according to a fifth embodiment of the present disclosure.

Referring to FIG. 1 and FIG. 2, in this embodiment, the air gap 108 has the width W1 in the second direction D2, and the width W1 is approximately equal to the width of the foldable portion R1 in the second direction D2, but not limited thereto. In a variant embodiment, the width W1 of the air gap 108 may be larger (as shown in FIG. 3) than the width of the foldable portion R1 in the second direction D2. In a variant embodiment, the width of the air gap 114 may be or smaller (as shown in FIG. 9) than the width of the foldable portion R1 in the second direction D2. In this embodiment, the intermediate layer 106 includes a first part 106a and a second part 106b, and the air gap 108 separates the first part 106a and the second part 106b by a distance, wherein the distance may be represented as the width W1 mentioned above. In some embodiments, the distance (the width W1) is, but not limited to, in a range from 0.1 mm to 100 mm. In some other embodiments, the distance is in a range from 0.1 mm to 50 mm.

According to some embodiments, the air gap 108 can help to release the folding stress of the display device 100 when it is folded. The range of the width W1 of the air gap 108 can be designed to optimize such stress-releasing performance. A folding test is conducted to evaluate damage resulted from folding. The display device 100 is folded with 100,000 times or more, and then the probability of damage is measured under microscope observation. The result shows that if the width W1 is greater than 100 mm, the adhesion performance of the intermediate layer 106 will be reduced, and the cover layer 104 may be lifted up from the display panel 102 after a folding test. If the width W1 is less than 0.1 mm, the stress-releasing performance will not be significant and thus the display device 100 may not pass the folding test, and the cover layer 104 and the intermediate layer 106 may be warped from the display panel 102. According to the present disclosure, it is designed such that the range of the width W1 may meet the equation: $0.01\pi R \leq W1 \leq 30\pi R$, wherein "R" represents the folding curvature (curving radius) of the foldable portion R1 with respect to the folding axis of the display device 100. For example, the folding curvature of the display device 100 may be in a range from 1 mm to 5 mm, and thus the width W1 may be in the above-mentioned range.

Furthermore, the display panel 102 has a first length L1 in the first direction D1, along the folding line FL, and the air gap 108 (as well as the intermediate layer 106) has a second length L2. In some embodiments, a ratio of the second length L2 to the first length L1 is designed in a range from 0.5 to 1.0. If the length ratio is less than 0.5, the display device 100 may not pass the folding test. In another aspect, a ratio of the total area of the intermediate layer 106 (including the first part 106a and the second part 106b) to the area of the display panel 102 may be designed in a range from 0.1 to 0.8. In addition, the sidewall 102s of the display panel 102 can be protrudent from the sidewall 106s of the intermediate layer 106 in this embodiment, but not limited thereto. In some embodiments, the sidewall 106s may be aligned with the sidewall 102s for example. The aforementioned range of length ratio or area ratio of the intermediate layer 106 to the display panel 102 may bring a suitable stress-releasing performance. It should be noted that the above-mentioned range of width W1, length ratio and area ratio may be applied to the follow embodiments and variant embodiments, which will not be repeated redundantly.

The display device of the present disclosure is not limited to the above mentioned embodiment. Further embodiments or variant embodiments of the present disclosure are described below. It should be noted that the technical features in different embodiments described can be replaced, recombined, or mixed with one another to constitute another embodiment without departing from the spirit of the present disclosure. For making it easier to compare the difference between the embodiments and variant embodiments, the following description will detail the dissimilarities among different variant embodiments or embodiments and the identical features will not be redundantly described.

Figure 4:
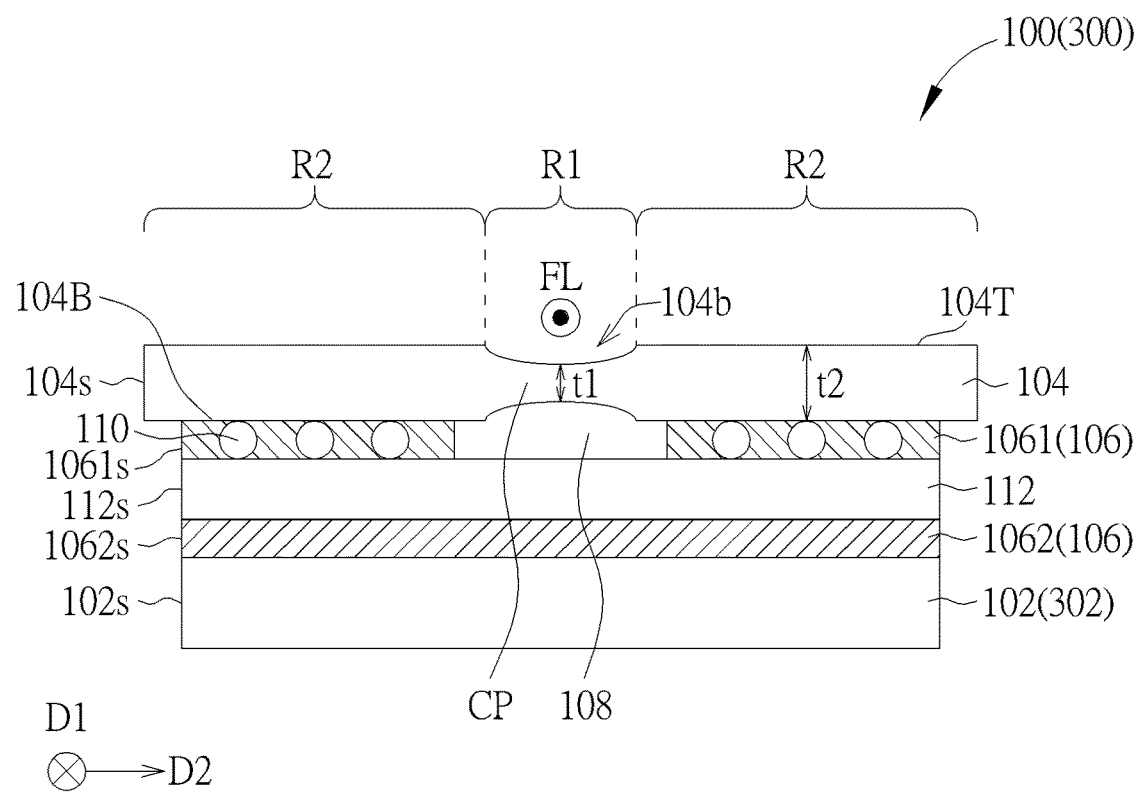
FIG. 4 is a schematic diagram of a cross-sectional view of the display device shown in FIG. 3.

Referring to FIG. 3 to FIG. 5, FIG. 3 is a schematic diagram of a top view of a display device according to a second embodiment of the present disclosure, FIG. 4 is a schematic diagram of a cross-sectional view of the display device shown in FIG. 3, and FIG. 5 is a schematic diagram illustrating the display device shown in FIG. 3 being folded inwardly. In this embodiment, the display device 100 further includes a polarizer 112 disposed between the cover layer 104 and the display panel 102, and the intermediate layer 106 includes a first intermediate layer 1061 disposed between the polarizer 112 and the cover layer 104 and a second intermediate layer 1062 disposed between the polarizer 112 and the display panel 102. The cover layer 104 is connected to the polarizer 112 through the first intermediate layer 1061, and the polarizer 112 is connected to the display panel 102 through the second intermediate layer 1062. The second intermediate layer 1062 may include the material identical to or different from the first intermediate layer 1061. The second intermediate layer 1062 may include, but not limited to, optical clear adhesive for example in this embodiment. In some embodiments, the polarizer 112 may be an inner-type polarizer film, which can be formed on the display panel 102 by a coating process or a printing process, and thus the second intermediate layer 1062 may be omitted.

According to this embodiment, the air gap 108 is formed in the first intermediate layer 1061, and the first intermediate layer 1061 is separated by the air gap 108 into a first part 106a and a second part 106b. Two connection parts 106t of the first intermediate layer 1061 are positioned between the first part 106a and the second part 106b for connecting the first part 106a and the second part 106b. The width W1 of the air gap 108 can be greater than the width of the foldable portion R1 in the second direction D2. The lengths of the first intermediate layer 1061 and the second intermediate layer 1062 in the first direction D1 can be approximately equal to the first length L1 of the display panel 102, and the second length L2 of the air gap 108 can be less than the first length L1. The areas of the display panel 102, the second intermediate layer 1062, and the polarizer 112 may be approximately the same, and the sidewall 1061s of the first intermediate layer 1061, the sidewall 112s of the polarizer 112, the sidewall 1062s of the second intermediate layer 1062, and the sidewall 102s of the display panel 102 may be aligned in a line.

In addition, at least one of the first part 106a and the second part 106b of the intermediate layer 106 (the first intermediate layer 1061) may include a plurality of sub-air gaps 110. The sub-air gaps 110 can be of different shapes. For example, the sub-air gaps 110 may be of a circle shape or a slit shape in a top view. In this embodiment, both the first part 106a and the second part 106b of the first intermediate layer 106 may have the sub-air gaps 110, and the sub-air gaps 110 have circle shapes in the top view, as shown in FIG. 3. The sub-air gaps 110 of this embodiment may be gas bubbles in the first intermediate layer 1061 for instance. As shown in FIG. 5, when the display device 100 is folded inwardly, the first intermediate layer 1061 may shift or be displaced, and the sub-air gaps 110 can provide buffer functionality for the displacement of the first intermediate layer 1061.

Furthermore, as shown in FIG. 4, the cover layer 104 has a central portion CP at least partially overlapping the air gap 108. In other words, the central portion CP overlaps the folding line FL in the direction perpendicular to the top surface 104T of the cover layer 104. The central portion CP may also correspond to the foldable portion R1. The part of the surface in the central portion CP may have an uneven surface in this embodiment. For example, the surface of the cover layer 104 corresponding to the foldable portion R1 can include a recess. For example, the cover layer 104 may include at least one first recess 104b in the central portion CP, and the first recess 104b at least partially overlaps the air gap 108. The first recess 104b can be disposed both on the top surface 104T and the bottom surface 104B of the cover layer 104, as shown in FIG. 4. In other embodiments, the first recess 104b can be disposed on one of the top surface 104T and the bottom surface 104B. The thickness t1 in the central portion CP is smaller than the thickness t2 out of the central portion CP of the cover layer 104. The partially reduced thickness t1 in the central portion CP of the cover layer 104 may bring a better folding performance, especially when the cover layer 104 has a greater hardness, such as that the cover layer 104 is made of glass.

Figure 6:
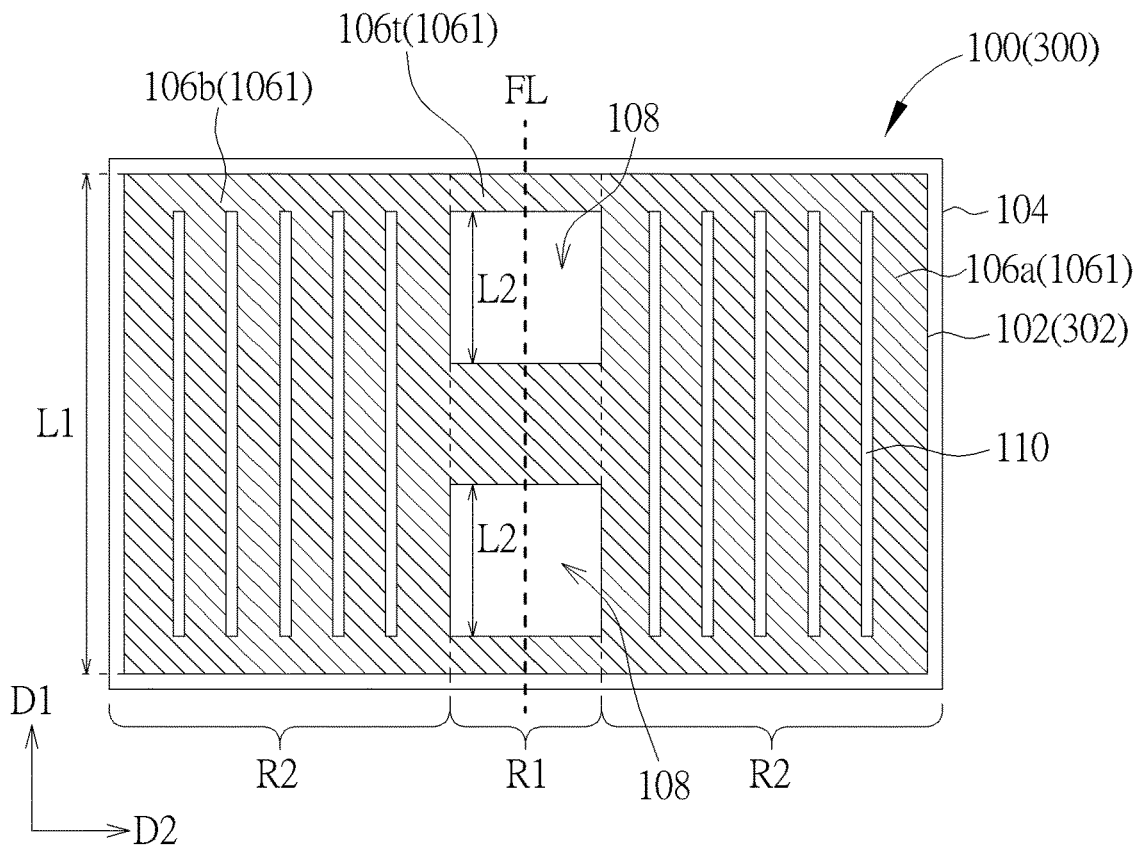
FIG. 6 is a schematic diagram of a top view of a display device according to a third embodiment of the present disclosure.

Referring to FIG. 6, FIG. 6 is a schematic diagram of a top view of a display device according to a third embodiment of the present disclosure. This embodiment is mainly different from the second embodiment in that the sub-air gaps 110 in the intermediate layer 106 are in a slit shape (a plurality of slits) extending along the first direction D1. Furthermore, the intermediate layer 106 includes a plurality of air gaps 108 across the folding line FL. Each of the air gaps 108 has a second length L2 along the folding line FL, and a ratio of the sum of the second lengths L2 of the air gaps 108 to the first length L1 of the display panel 102 can be in a range from 0.5 to 1.0. If the length ratio is less than 0.5, the display device 100 may not pass the folding test mentioned above.

Figure 7:
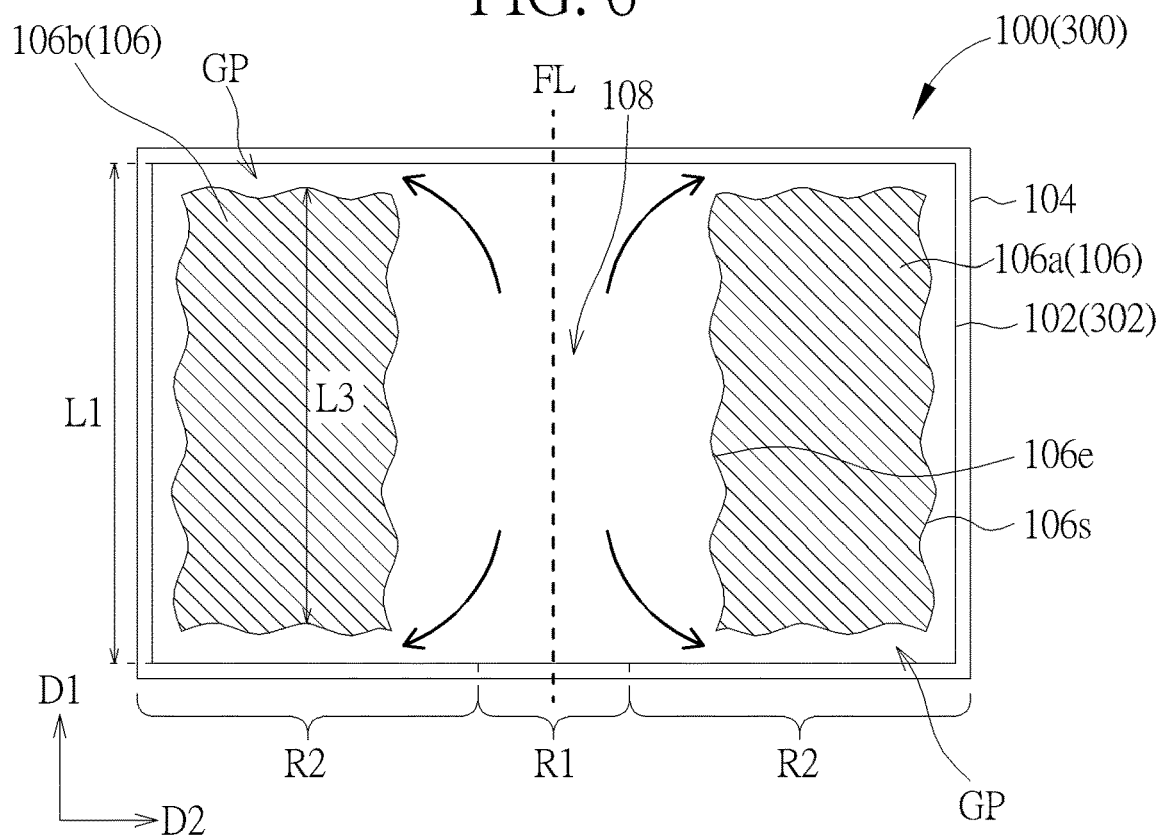
FIG. 7 is a schematic diagram of a top view of a display device according to a fourth embodiment of the present disclosure.
Figure 8:
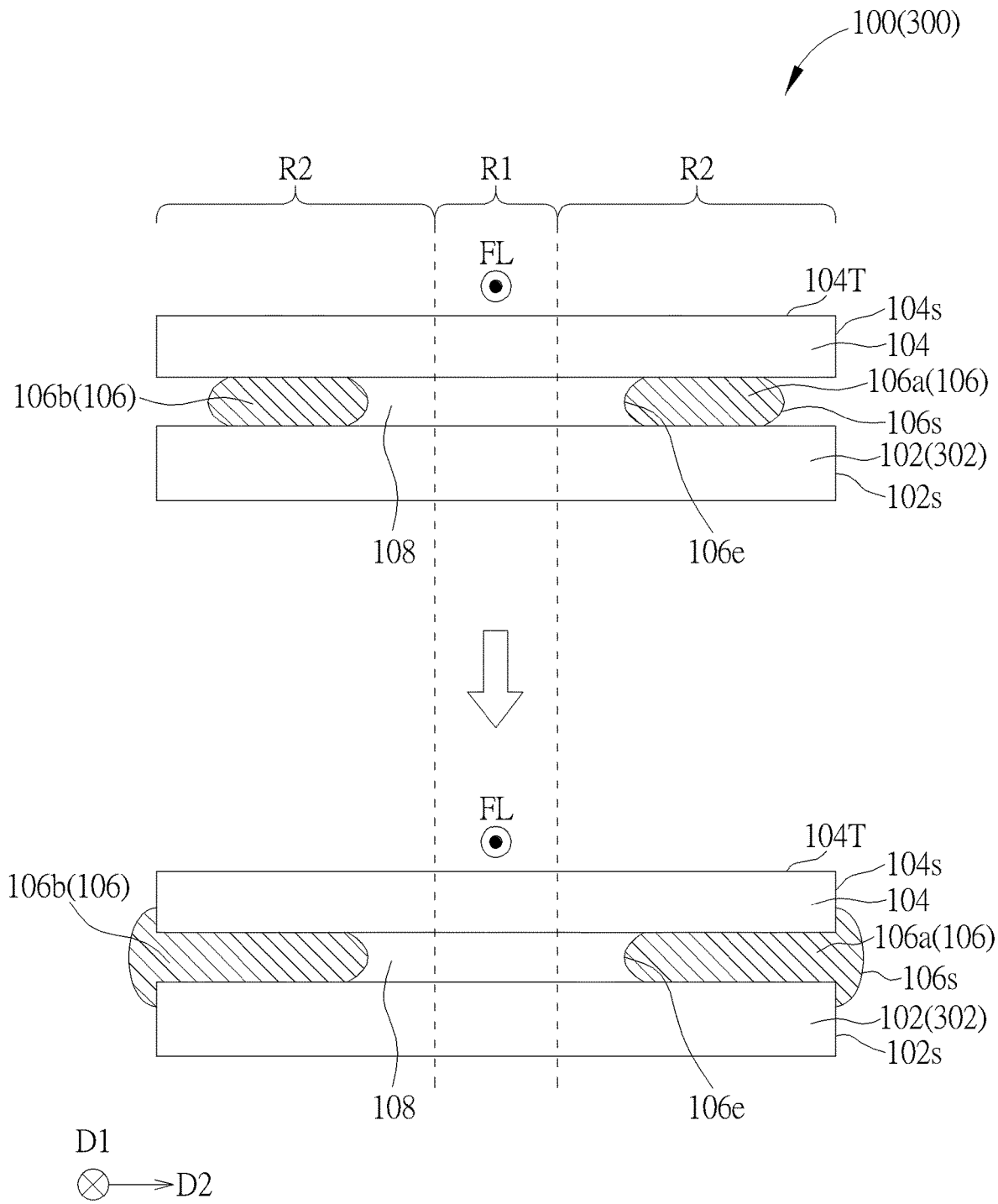
FIG. 8 is a schematic diagram of sectional views of the display device shown in FIG. 7

Referring to FIG. 7 to FIG. 8, FIG. 7 is a schematic diagram of a top view of a display device according to a fourth embodiment of the present disclosure, and FIG. 8 is a schematic diagram of sectional views of the display device shown in FIG. 7. FIG. 8 also shows the relative position of the intermediate layer before and after the display device is folded for many times, which are respectively shown in the upper part and the lower part of FIG. 8. Referring to FIG. 8, the intermediate layer 106 may have a profile in the cross-sectional view, and at least a portion of the profile is in a curved shape. For example, the inner edge 106e and the outer sidewall 106s of the intermediate layer 106 have a profile of curved shape. In addition, in the top view, at least a portion of the edge of the intermediate layer 106 can be in a wavy shape. For example, referring to FIG. 7, the inner edge 106e and the outer sidewall 106s of the intermediate layer 106 can be in a wavy shape. As shown in the upper part of FIG. 8, when using the intermediate layer 106 to attach the cover layer 104 onto the display panel 102, the sidewall 106s of the intermediate layer 106 may be positioned within the region of the display panel 102. However, after being folded for many times, the intermediate layer 106 may shift or be displaced such that the outer sidewall 106s may be extruded out of the space between the display panel 102 and the cover layer 104, protrudent from the sidewall 102s of the display panel 102 and the sidewall 104s of the cover layer 104. However, the inner edge 106e may still be in a wavy shape. The wavy edge 106e or sidewall 106s resulted in a greater contact area between the intermediate layer 106 and the cover layer 104 or the display panel 102, which may increase the adhesion performance. In addition, the intermediate layer 106 has a third length L3 (average length) in the first direction D1. In some embodiments, the third length L3 of the intermediate layer 106 can be less than the first length L1 of the display panel 102 in the first direction D1. In such case, at the upper side and the lower side of the intermediate layer 106, gap paths GP can be formed between the cover layer 104 and the display panel 102, as shown in FIG. 7. The gas paths GP connect with and communicate with the air gap 108. As a result, when the display device 100 is folded, the stress may be released from the air gap 108 through the gap paths GP to outside of the display device 100, as shown by the four bold arrows, which can provide a better stress-releasing performance.

Figure 10:
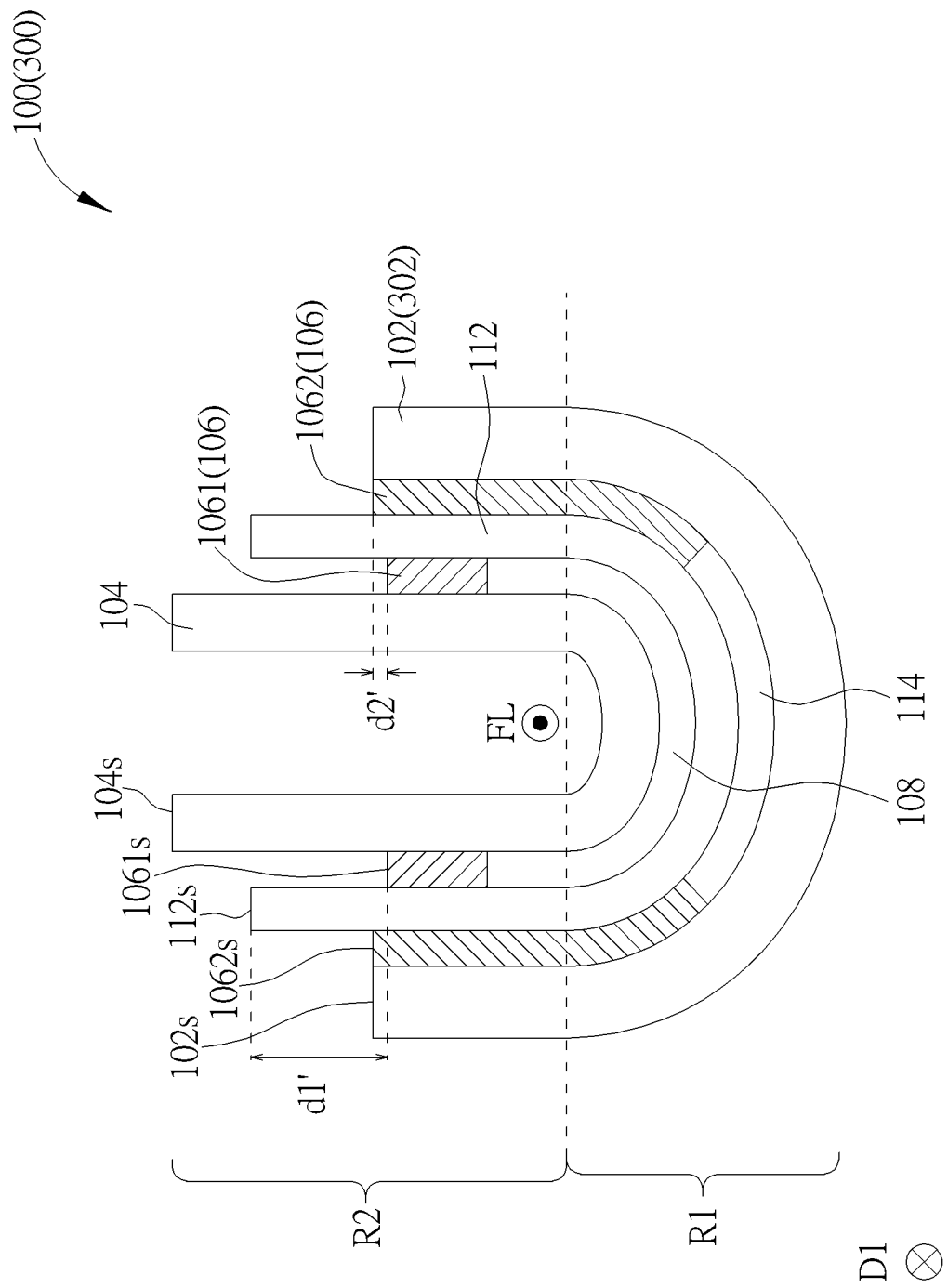
FIG. 10 is a schematic diagram illustrating the display device shown in FIG. 9 being folded inwardly.

Referring to FIG. 9 to FIG. 10, FIG. 9 is a schematic diagram of a sectional view of a display device according to a fifth embodiment of the present disclosure, and FIG. 10 is a schematic diagram illustrating the display device shown in FIG. 9 being folded inwardly. Similar to the second embodiment, the intermediate layer 106 of the display device 100 shown in FIG. 9 and FIG. 10 includes a first intermediate layer 1061 and a second intermediate layer 1062. However, both the first intermediate layer 1061 and the second intermediate layer 1062 have air gaps. Referring to FIG. 9, the first intermediate layer 1061 includes the air gap 108 across the folding line FL, and the second intermediate layer 1062 includes another air gap 114 across the folding line FL. The air gap 108 and the air gap 114 may be filled with air or any gas in the formation process. According to this embodiment, the width of the air gap 108 may be the same as or different from the width of the air gap 114 in the second direction D2. In this embodiment, the width of the air gap 108 may be wider than the width of the foldable portion R1 in the second direction D2, and the width of the air gap 114 may be narrower than the foldable portion R1 in the second direction D2, but not limited thereto. The widths of the air gap 114 and the air gap 108 may be varied as design requirement. The disposition of the air gap 114 may help the stress-releasing between the polarizer 112 and the display panel 102. In this embodiment, the first intermediate layer 1061 and the second intermediate layer 1062 may have the same material, as mentioned in the first embodiment, but not limited thereto. In variant embodiments, the first intermediate layer 1061 and the second intermediate layer 1062 may have different materials. The area of the cover layer 104 may be larger than the polarizer 112, the display panel 102, the first intermediate layer 1061, and the second intermediate layer 1062. In addition, the sidewall 1061s of the first intermediate layer 1061 can be within the region of the polarizer 112 and within the region of the display panel 102. Accordingly, the sidewall 112s of the polarizer 112 can be protrudent from the sidewall 1061s of the first intermediate layer 1061 by a first distance d1, and the sidewall 102s of the display panel 102 can be protrudent from the sidewall 1061s of the first intermediate layer 1061 by a second distance d2. Furthermore, the area of the polarizer 112 can be larger than the area of the display panel 102, and the sidewall 112s of the polarizer 112 is also protrudent from the sidewall 102s of the display panel 102. As shown in FIG. 9, the cover layer 104 and the polarizer 112 may be misplaced with respect to the display panel 102. Referring to FIG. 9 and FIG. 10, the first distance d1' in the folding mode may become greater than the first distance d1 in the flat mode, and the second distance d2' in the folding mode may become less than the second distance d2 in the flat mode. However, the sidewall 112s of the polarizer 112 is still protrudent from the sidewall 102s of the display panel 102, which may prevent light leakage in the folding mode.

Figure 11:
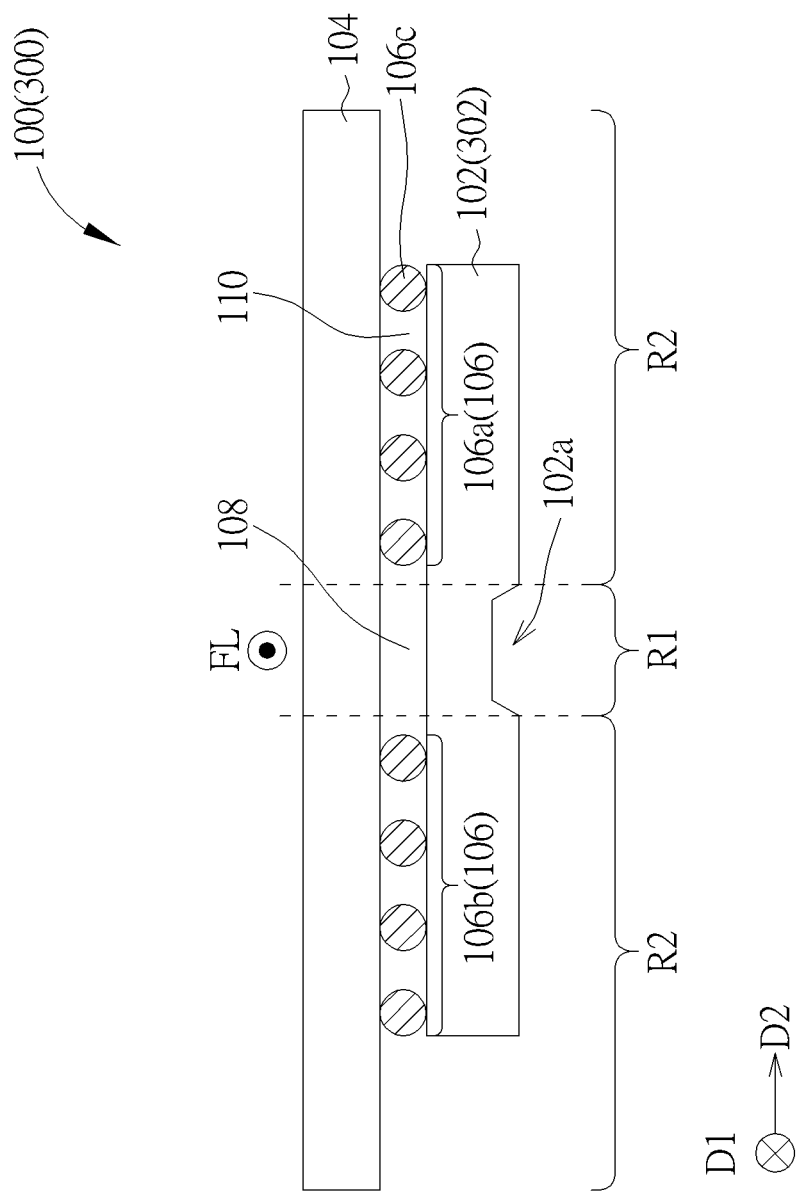
FIG. 11 is a schematic diagram of a sectional view of a display device according to a sixth embodiment of the present disclosure.
Figure 12:
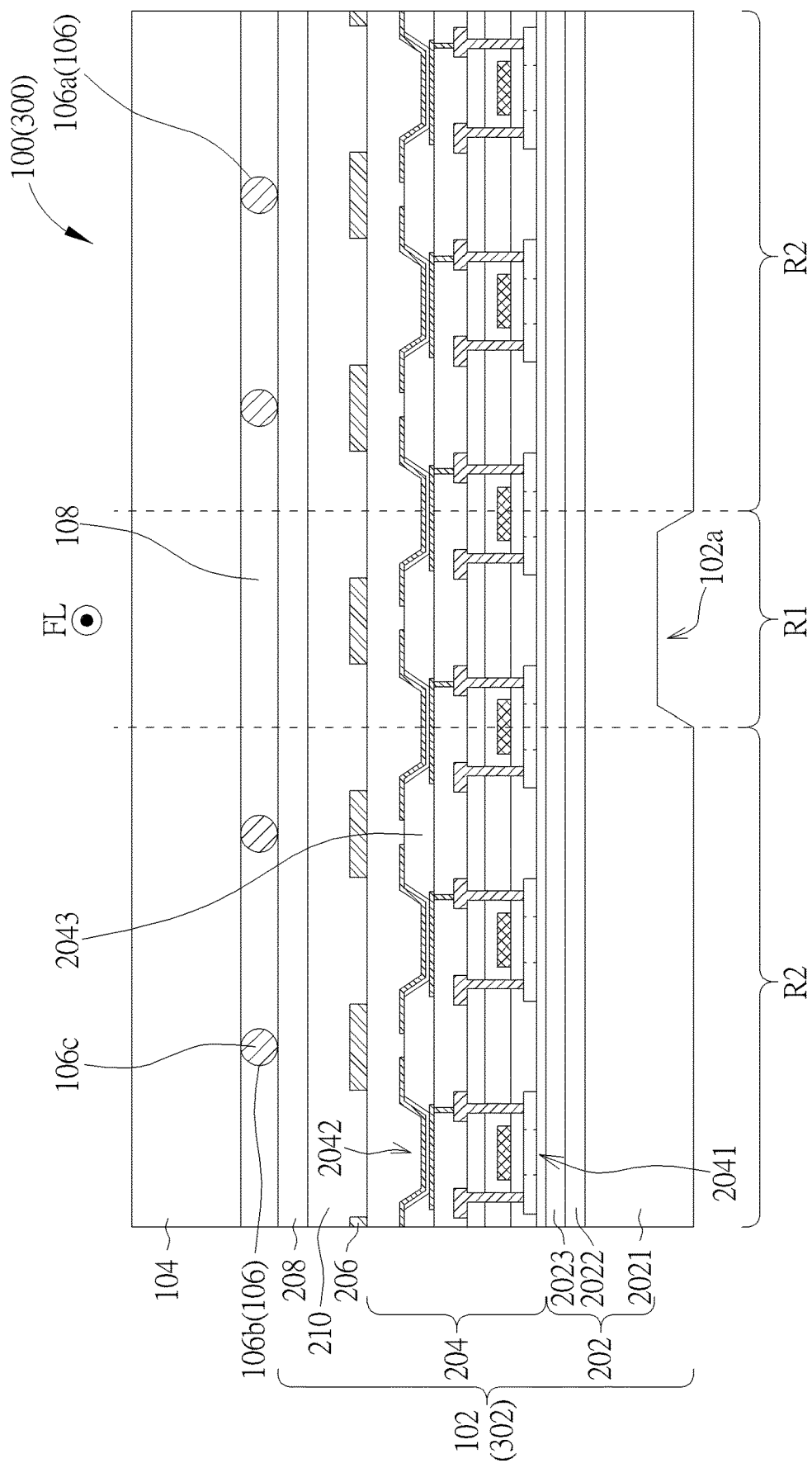
FIG. 12 is a schematic diagram of the partial enlargement of the display device shown in FIG. 11.

Referring to FIG. 11 to FIG. 12, FIG. 11 is a schematic diagram of a sectional view of a display device according to a sixth embodiment of the present disclosure, and FIG. 12 is a schematic diagram of the partial enlargement of the display device shown in FIG. 11. In this embodiment, the air gap 108 separates the first part 106a and the second part 106b of the intermediate layer 106, and at least one of the first part 106a and the second part 106b includes a plurality of ball spacers 106c. For example, in FIG. 11, both the first part 106a and the second part 106b include ball spacers 106c. A plurality of sub-air gaps 110 can be formed by the space among the ball spacers 106c. In other words, the intermediate layer 106 of this embodiment includes a plurality of ball spacers 106c disposed between the cover layer 104 and the display panel 102, and the sub-air gaps 110 are formed among the ball spacers 106c. For example, the ball spacers 106c may be disposed randomly and may provide supporting and adhesive function to the cover layer 104 and the display panel 102. The disposition of the ball spacers 106c may also provide the buffer function when the display device 100 is folded. The ball spacers 106c may include organic polymer material, such as polyimide, but not limited thereto. As shown in FIG. 12, the display panel 102 may include a substrate layer 202, a display layer 204, a touch layer 206, and an inner polarizer 208. The substrate layer 202 may include a supporting film 2021, a flexible substrate 2022, and a buffer layer 2023. The flexible substrate 2022 can be adhered to the supporting film 2022 through a glue. In this embodiment, the supporting film 2021 may have a second recess 102a corresponding to the foldable portion R1 and at least partially overlapping the air gap 108, such that the substrate layer 202 may be easily folded. The display layer 204 may include a plurality of switch elements 2041 (such as TFT) and light emitting elements 2042. The light emitting elements 2042 may include organic light-emitting diodes in this embodiment, but not limited thereto. In variant embodiments, the light emitting elements 2042 may include mini light-emitting diodes (LED), micro LED or quantum dot LED for example. The light emitting region of each light emitting element 2042 can be defined by a pixel defining layer (PDL) 2043, and the ball spacers 106c may be disposed corresponding to the PDL 2043 such that they will not shield the light emitting regions. In addition, the touch layer 206 may include a plurality of touch electrodes disposed above the PDL 2043 for providing touch sensing function. An optional protection layer 210 may cover the touch layer 206, which may provide a planar surface. The inner polarizer 208 in this embodiment replaces the polarizer 112 described in the previous embodiments and may be formed on the protection layer 210 by a coating or printing process, thus the second intermediate layer 1062 shown in FIG. 4 is not required.

Figure 13:
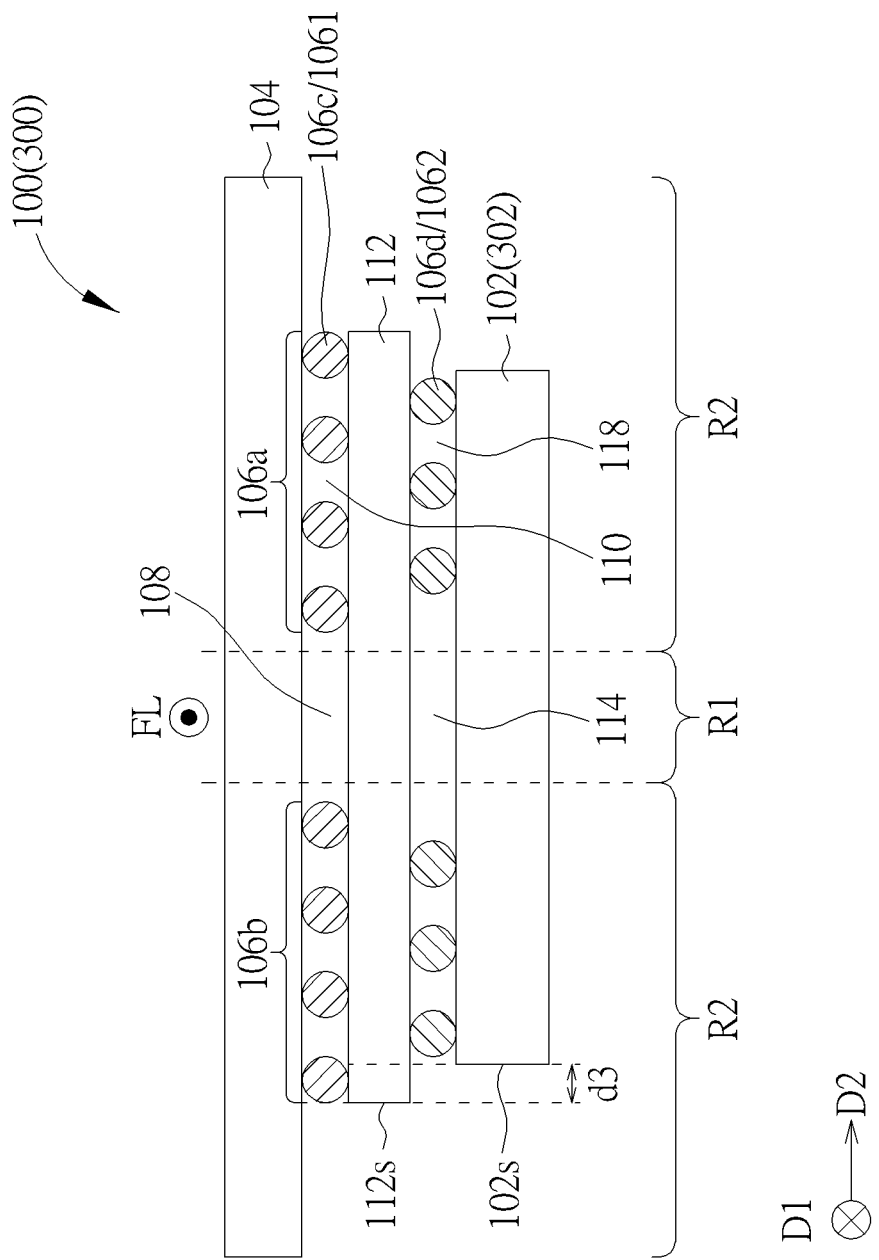
FIG. 13 is a schematic diagram of a sectional view of a display device according to a seventh embodiment of the present disclosure.

Referring to FIG. 13, FIG. 13 is a schematic diagram of a sectional view of a display device according to a seventh embodiment of the present disclosure. This embodiment is mainly different from the fifth embodiment shown in FIG. 9 in that the first intermediate layer 1061 and the second intermediate layer 1062 include ball spacers 106*c* and ball spacers 106*d* respectively. In the first intermediate layer 1061, the air gap 108 across the folding line FL is also formed between the cover layer 104 and the polarizer 112, and a plurality of sub-air gaps 110 are formed corresponding to the main portions R2 of the display device 100. Similarly, in the second intermediate layer 1062, the air gap 114 across the folding line FL is formed between the display panel 102 and the polarizer 112, and a plurality of sub-air gaps 118 are formed corresponding to the main portions R2 of the display device 100. In addition, the area of the polarizer 112 may be larger than the display panel 102, and the sidewall 112*s* of the polarizer 112 is protrudent from the sidewall 102*s* of the display panel 102 by a third distance d3, so as to prevent light leakage issue.

Figure 14:
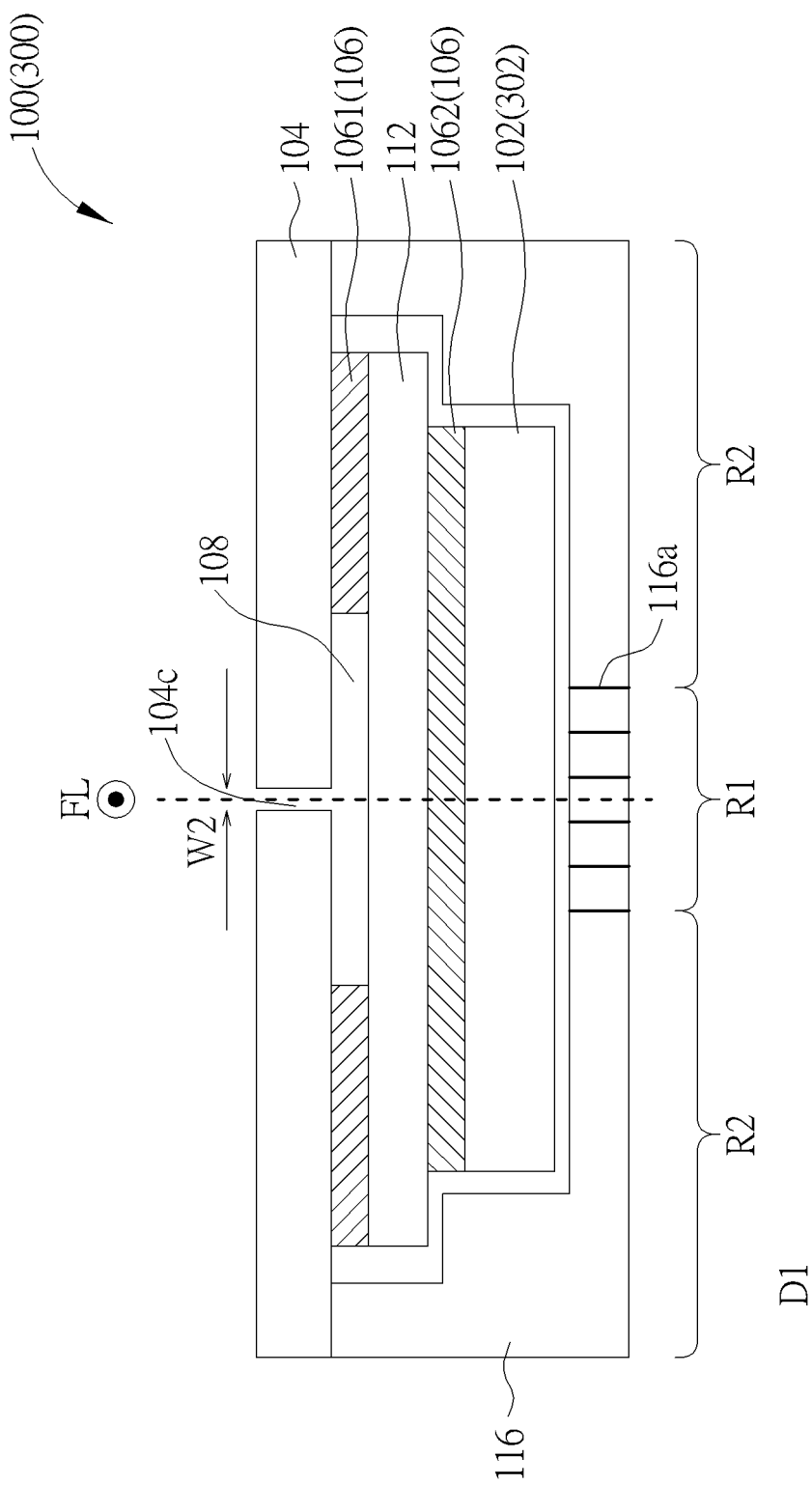
FIG. 14 is a schematic diagram of a sectional view of a display device according to an eighth embodiment of the present disclosure.

Referring to FIG. 14, FIG. 14 is a schematic diagram of a sectional view of a display device according to an eighth embodiment of the present disclosure. In this embodiment, the cover layer 104 has an opening 104*c* at least partially overlapping the air gap 108. In addition, the opening 104*c* of the cover layer 104 overlaps the folding line FL. The width W2 of the opening 104*c* in the second direction D2 is in a range from 0.1 mm to 2 mm. The opening 104*c* may facilitate to release stress for the cover layer 104 and the first intermediate layer 1061 and provide a release path. In addition, the display device 100 of this embodiment further includes a housing 116 surrounding the display panel 102 and the polarizer 112, and the housing 116 is connected to the periphery edge of the cover layer 104. The housing 116 may be formed with, but not limited to, glass, metal, plastic material, liquid metal or other flexible materials for example. In this embodiment, the housing 116 may be made of rigid material, such as glass or metal, and the portion of the housing 116 corresponding to the foldable portion R1 can include one or more hinges 116*a*, such that the housing 116 can be folded in the foldable portion R1. Any other suitable folding design may be adopted for the housing 116. The housing 116 of this embodiment may be applied to other embodiments or variant embodiments of the present disclosure.

Figure 15:
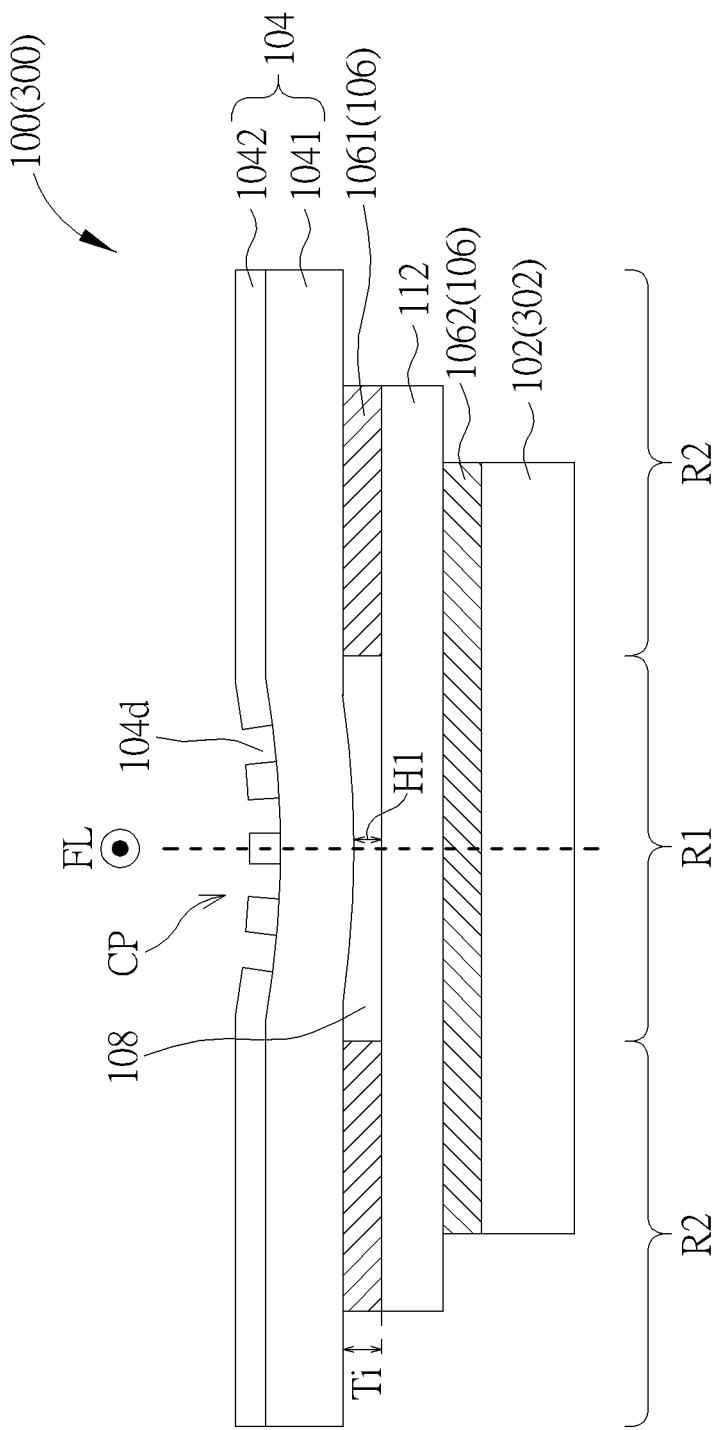
FIG. 15 is a schematic diagram of a sectional view of a display device according to a ninth embodiment of the present disclosure.

Referring to FIG. 15, FIG. 15 is a schematic diagram of a sectional view of a display device according to a ninth embodiment of the present disclosure. In this embodiment, the first intermediate layer 1061 has an air gap 108 while the second intermediate layer 1062 may have no air gap disposed therein. The cover layer 104 of this embodiment has an uneven surface. For example, the cover layer 104 includes a base film 1041 and a coating film 1042. The coating film 1042 can be a hard coating film with a great hardness. For example, the hardness of the hard coating layer 1042 may be equal to or more than about 5H. Both the base film 1041 and the hard coating film 1042 have an indentation surface in the central portion CP of the cover layer 104. Therefore, the height H1 of the air gap 108 corresponding to the folding line FL is smaller than the thickness Ti of the first intermediate layer 1061. Furthermore, the hard coating film 1042 may have patterns 104*d* such as slits or openings in the central portion CP. According to this embodiment, the base film 1041 may be made from at least one resin selected from the group consisting of a polyester-based resin, a polyether sulfone-based resin, a cellulose-based resin, an acrylic resin, a styrene-based resin, a polyolefin-based resin, a polyimide-based resin, a polycarbonate-based resin, and a sulfone-based resin, but not limited. The hard coating film 1042 may be made from photo-radical polymerization initiator, photo-cationic polymerization initiator, thermal polymerization initiator, or silicon compound includes a disulfide group, which connects adjacent siloxane groups, but not limited. However, any other suitable material may be used for forming the base film 1041 and the hard coating film 1042.

According to the display device of the present disclosure, at least one air gap is formed between the intermediate layer, the cover layer, and the display panel, and the air gap corresponds to and is across the folding line of the display panel. The range of the width or the length of the air gap may be designed in accordance with the curvature or length of the display panel. According to some embodiments, stress induced by folding of the display device can be released.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A display device comprising: a display panel including a folding line; and a cover layer connected to the display panel through an intermediate layer; wherein the display panel, the cover layer and the intermediate layer form at least one air gap across the folding line, wherein the display panel has a first length along the folding line, the at least one air gap has a second length along the folding line, and a ratio of the second length to the first length is in a range from 0.5 to 1.

2. The display device as claimed in claim 1, wherein the air gap extends along the folding line.

3. The display device as claimed in claim 1, wherein the intermediate layer includes a first part and a second part, and the air gap separates the first part and the second part by a distance.

4. The display device as claimed in claim 3, wherein the distance is in a range from 0.1 mm to 100 mm.

5. The display device as claimed in claim 3, wherein the distance is in a range from 0.1 mm to 50 mm.

6. The display device as claimed in claim 3, wherein at least one of the first part and the second part of the intermediate layer includes a plurality of sub-air gaps.

7. The display device as claimed in claim 6, wherein the sub-air gaps are of a circle shape or a slit shape in a top view.

8. The display device as claimed in claim 1, wherein the intermediate layer has a thickness in a range from 0.01 mm to 1 mm.

9. The display device as claimed in claim 1, further comprising a polarizer disposed between the cover layer and the display panel, wherein the intermediate layer comprises:
a first intermediate layer disposed between the polarizer and the cover layer, wherein the air gap is disposed in the first intermediate layer; and
a second intermediate layer disposed between the polarizer and the display panel.

10. The display device as claimed in claim 1, wherein the cover layer includes a first recess at least partially overlapping the air gap.

11. The display device as claimed in claim 1, wherein the intermediate layer includes an adhesive material.

12. A foldable electronic device comprising: an electronic element including a folding line; and a cover layer connected to the electronic element through an intermediate layer; wherein the electronic element, the cover layer and the intermediate layer form at least one air gap across the folding line, wherein the electronic element has a first length along the folding line, the at least one air gap has a second length along the folding line, and a ratio of the second length to the first length is in a range from 0.5 to 1.

* * * * *